US011455973B2

(12) United States Patent
Ma (10) Patent No.: US 11,455,973 B2
(45) Date of Patent: Sep. 27, 2022

(54) PROGRAMMABLE LOGIC DEVICE-BASED DATA PROCESSING APPARATUS AND DRIVING METHOD THEREFOR, AND DISPLAY APPARATUS (71) Applicant: BOE TECHNOLOGY GROUP CO., LTD., Beijing (CN)

(72) Inventor: Xitong Ma, Beijing (CN)

(73) Assignee: Beijing BOE Technology Development Co., Ltd., Beijing (CN)

(*) Notice: Subject to any disclaimer, the term of this patent is extended or adjusted under 35 U.S.C. 154(b) by 0 days.

(21) Appl. No.: 17/254,397

(22) PCT Filed: Apr. 27, 2020

(86) PCT No.: PCT/CN2020/087319
§ 371 (c)(1),
(2) Date: Dec. 21, 2020

(87) PCT Pub. No.: WO2020/238527
PCT Pub. Date: Dec. 3, 2020

(65) Prior Publication Data
US 2021/0272534 A1    Sep. 2, 2021

(30) Foreign Application Priority Data

May 24, 2019   (CN) .......................... 201910441140.5

(51) Int. Cl.
G09G 5/373        (2006.01)
G05F 1/10         (2006.01)
(Continued)

(52) U.S. Cl.
CPC .............. *G09G 5/373* (2013.01); *G05F 1/10* (2013.01); *G06T 3/40* (2013.01); *H03K 19/173* (2013.01);
(Continued)

(58) Field of Classification Search
CPC .. G05F 1/10; G09G 5/373; G09G 2340/0407; G09G 2330/08; G06T 3/40; H03K 19/173
See application file for complete search history.

(56) References Cited

U.S. PATENT DOCUMENTS 6,166,515 A * 12/2000 Barde ................. H02J 7/35
320/101
6,324,081 B1 * 11/2001 Sakamoto ............ H04N 3/185
363/25

(Continued)

FOREIGN PATENT DOCUMENTS

CN    1591532 A    3/2005
CN    1826721 A    8/2006
(Continued)

OTHER PUBLICATIONS

Third Office Action for CN Patent Application No. 201910441140.5 dated Nov. 12, 2021.

(Continued)

*Primary Examiner* — Phi Hoang
(74) *Attorney, Agent, or Firm* — Perilla Knox & Hildebrandt LLP; Kenneth A. Knox (57) ABSTRACT A data processing device based on a programmable logic device is described that includes at least one function circuit configured to process input data; and at least one current smoothing circuit, each corresponding to one of the at least one function circuit, and configured to smooth a current change of the programmable logic device caused when a corresponding function circuit is switched between on and off. The current smoothing circuit includes a control circuit configured to generate a driving signal based on a switching manner of the function circuit corresponding to the current smoothing circuit; and a redundant circuit configured to operate according to the driving signal to smooth the current (Continued)

change. The control circuit includes a decoding control word generating circuit and a decoding circuit.

15 Claims, 3 Drawing Sheets

(51) Int. Cl.
 *G06T 3/40* (2006.01)
 *H03K 19/173* (2006.01)
(52) U.S. Cl.
 CPC . *G09G 2330/08* (2013.01); *G09G 2340/0407* (2013.01)

(56) References Cited

U.S. PATENT DOCUMENTS

| | | | |
|---|---|---|---|
| 7,215,140 | B1 | 5/2007 | Saini et al. |
| 10,482,847 | B2 | 11/2019 | Nakai |
| 2005/0231241 | A1* | 10/2005 | Date ................... H03M 1/1057 327/108 |
| 2011/0260704 | A1* | 10/2011 | Blau ....................... H02M 1/36 323/299 |
| 2012/0250401 | A1* | 10/2012 | Storms ............... G11C 13/0069 365/163 |
| 2012/0256690 | A1* | 10/2012 | Buescher ............. H03F 1/3205 330/288 |
| 2017/0243566 | A1 | 8/2017 | Nakai |
| 2018/0278323 | A1* | 9/2018 | Trutna ............... H04B 7/18521 |

FOREIGN PATENT DOCUMENTS

| | | |
|---|---|---|
| CN | 101699732 A | 4/2010 |
| CN | 101699732 B | 4/2010 |
| CN | 102315806 A | 1/2012 |
| CN | 202282637 U | 6/2012 |
| CN | 101699732 B | 8/2012 |
| CN | 103079314 A | 5/2013 |
| CN | 103516043 A | 1/2014 |
| CN | 103702060 A | 4/2014 |
| CN | 104410088 A | 3/2015 |
| CN | 104809977 A | 7/2015 |
| CN | 103516043 B | 9/2015 |
| CN | 108572376 A | 9/2018 |
| CN | 108880537 A | 11/2018 |
| CN | 109194213 A | 1/2019 |
| CN | 109215595 A | 1/2019 |
| CN | 110164354 A | 8/2019 |
| EP | 3300071 A1 | 3/2018 |
| JP | 2000039864 A | 2/2000 |
| KR | 20140008853 A | 1/2014 |
| KR | 101438124 B1 | 9/2014 |
| TW | 201423699 A | 6/2014 |

OTHER PUBLICATIONS

Second Office Action for CN Patent Application No. 201910441140.5 dated Jul. 13, 2021.
First Office Action for CN Patent Application No. 201910441140.5, dated Feb. 2, 2021.
International Search Report for PCT/CN2020/087319 dated Jul. 24, 2020.
Written Opinion of the International Searching Authority for PCT/CN2020/087319, dated Jul. 24, 2020.

* cited by examiner

FIG. 7

PROGRAMMABLE LOGIC DEVICE-BASED DATA PROCESSING APPARATUS AND DRIVING METHOD THEREFOR, AND DISPLAY APPARATUS

CROSS-REFERENCE TO RELATED APPLICATIONS

The present application is a national phase application under 35 U.S.C. § 371 of International Patent Application No. PCT/CN2020/087319, filed on Apr. 27, 2020, which claims the benefit of and priority to Chinese Patent Application No. 201910441140.5, titled "PROGRAMMABLE LOGIC DEVICE-BASED DATA PROCESSING APPARATUS AND DRIVING METHOD THEREFOR, AND DISPLAY APPARATUS" filed on May 24, 2019, the entire contents of which are incorporated herein by reference.

TECHNICAL FIELD

The present disclosure is directed to a data processing device based on a programmable logic device and a driving method thereof, and a display device.

BACKGROUND

A user may program a programmable logic device (PLD) to obtain a device with a desired logic function without customizing an integrated chip. A field programmable gate array (FPGA) is widely used due to advantages thereof such as high programmable flexibility, short development cycle and high parallel computing efficiency. The PLD, especially an FPGA, may be used as a data processing device, especially an image data processing device in a display device, to shorten the development cycle of the display device, and increase market share and corresponding profit.

SUMMARY

Embodiments of the present disclosure provide a data processing device based on a programmable logic device, a method for driving the data processing device based on the programmable logic device, a method for setting a current smoothing circuit in the data processing device, and a display device.

According to a first aspect of the present disclosure, a data processing device based on a programmable logic device is provided. The device includes: at least one function circuit, configured to process input data; and at least one current smoothing circuit, each corresponding to one of the at least one function circuit, and configured to smooth a current change of the programmable logic device caused when a corresponding function circuit is switched between on and off.

In an embodiment of the present disclosure, the current smoothing circuit includes: a control circuit, configured to generate a driving signal based on a switching manner of the function circuit corresponding to the current smoothing circuit; and a redundant circuit, configured to operate according to the driving signal to smooth the current change.

In an embodiment of the present disclosure, the control circuit includes: a decoding control word generating circuit, configured to generate a control word based on the switching mode of the function circuit corresponding to the current smoothing circuit; and a decoding circuit, configured to generate the driving signal based on the control word.

In an embodiment of the present disclosure, a number of flip-flops in the redundant circuit is smaller than a number of flip-flops in the corresponding function circuit.

In an embodiment of the present disclosure, the number of flip-flops in the redundant circuit is 1/N of the number of flip-flops in the corresponding function circuit, where N is a positive integer.

In an embodiment of the present disclosure, N may be 16.

In an embodiment of the present disclosure, the flip-flops in the redundant circuit are divided into M groups. The driving signal includes M sub-driving signals. Each of the M sub-driving signals is configured to drive a corresponding group of the M groups of flip-flops, where M is an integer greater than 1.

In an embodiment of the present disclosure, M may be 64.

In an embodiment of the present disclosure, the data processing device further includes: a determining circuit, configured to determine a to-be-switched function circuit and the switching manner thereof, and to provide the switching manner obtained to the decoding control word generating circuit in the current smoothing circuit corresponding to the to-be-switched function circuit; and a memory, configured to store an operating frequency of the redundant circuit, wherein a ratio of an absolute value of a difference between a power of the redundant circuit at the operating frequency and a power of the corresponding function circuit to the power of the corresponding function circuit is within a threshold range, and wherein the threshold range is from 0 to 10%.

In an embodiment of the present disclosure, the data processing device further includes: an input circuit, configured to receive data to be processed and transmit the data received to the at least one function circuit; and an output circuit, configured to output the data from the at least one function circuit.

In an embodiment of the present disclosure, the data processing device may be an image data processing device. In the image data processing device, the input circuit includes: a first resolution data input circuit, configured to receive image data of a first resolution, and a second resolution data input circuit, configured to receive image data of a second resolution, wherein the first resolution is smaller than the second resolution. The at least one function circuit includes: a conversion circuit, configured to convert the image data of the first resolution from the first resolution data input circuit into image data of the second resolution, and an image processing circuit, configured to perform image processing on the image data of the second resolution from the conversion circuit or the image data of the second resolution from the second resolution data input circuit. The output circuit is configured to output the image data from the image processing circuit. The current smoothing circuit is configured to smooth the current change of the programmable logic device caused when the conversion circuit is switched between on and off.

In an embodiment of the present disclosure, the image data of the first resolution may be 4K image data, and the image data of the second resolution may be 8K image data.

According to a second aspect of the present disclosure, a display device is provided. The display device includes the data processing device based on the programmable logic device according to the first aspect of the present disclosure.

According to a third aspect of the present disclosure, a method for driving the data processing device based on the programmable logic device according to the first aspect of the present disclosure is provided. The method includes: determining, among the at least one function circuit, a to-be-switched function circuit and a switching manner thereof; and smoothing, by the current smoothing circuit corresponding to the to-be-switched function circuit, a current change of the programmable logic device caused when the function circuit is switched between on and off.

In an embodiment of the present disclosure, the current smoothing circuit includes a control circuit and a redundant circuit, and smoothing the current change of the programmable logic device caused when the function circuit is switched between on and off includes:

in response to that the to-be-switched function circuit is to be switched from on to off, switching on the redundant circuit while the to-be-switched function circuit is switched off, to make a ratio of an absolute value of a difference between a maximum power of the redundant circuit and a power of the to-be-switched function circuit to the power of the to-be-switched function circuit to be within a threshold range, and then gradually reducing the power of the redundant circuit within a predetermined time; and in response to that the to-be-switched function circuit is to be switched from off to on, gradually increasing the power of the redundant circuit within the predetermined time before the to-be-switched function circuit is switched on, to make the ratio of the absolute value of the difference between the power of the redundant circuit and the power of the to-be-switched function circuit to the power of the to-be-switched function circuit to be within the threshold range, and then switching off the redundant circuit while the to-be-switched function circuit is switched on.

In an embodiment of the present disclosure, the redundant circuit includes M groups of flip-flops, and M is an integer greater than 1, wherein in response to that the to-be-switched function circuit is to be switched from on to off, the M groups of flip-flops are switched off group by group while the to-be-switched function circuit is switched off, until the M groups of flip-flops are all switched off, and wherein in response to that the to-be-switched function circuit is to be switched from off to on, the M groups of flip-flops are switched on group by group until the M groups of flip-flops are all switched on.

According to a fourth aspect of the present disclosure, a method for setting the current smoothing circuit in the data processing device according to the first aspect of the present disclosure is provided, wherein the current smoothing circuit includes a redundant circuit. The method includes setting the redundant circuit by: determining a power of the function circuit corresponding to the redundant circuit; and determining a number of flip-flops in the redundant circuit and an operating frequency of the redundant circuit by making a ratio of an absolute value of a difference between a maximum power of the redundant circuit and a power of a corresponding function circuit to the power of the corresponding function circuit to be within a threshold range.

In an embodiment of the present disclosure, determining the number of flip-flops in the redundant circuit and the operating frequency of the redundant circuit includes: determining the number of flip-flops in the redundant circuit as 1/N of the number of flip-flops in the corresponding function circuit, where N is a positive integer; and determining the operating frequency of the redundant circuit by making the ratio of the absolute value of the difference between the maximum power of the redundant circuit and the power of the corresponding function circuit to the power of the corresponding function circuit to be within the threshold range, wherein the threshold range may be from 0 to 10%.

BRIEF DESCRIPTION OF THE DRAWINGS

In order to explain the technical solutions of the embodiments of the present disclosure more clearly, the drawings of the embodiments will be briefly described below. It shall be understood that the drawings described below only relate to some embodiments of the present disclosure, rather than limit the present disclosure. Throughout the various views of these drawings, corresponding reference numbers indicate corresponding parts or features.

DETAILED DESCRIPTION

The technical solutions of the embodiments of the present disclosure will be described clearly and completely below in conjunction with the accompanying drawings, in order to make the objectives, technical solutions, and advantages of the embodiments of the present disclosure clearer. Understandably, the described embodiments are part rather than all of the embodiments of the present disclosure. Based on the described embodiments of the present disclosure, all other embodiments obtained by those skilled in the art without creative labor are also within the protection scope of the present disclosure.

When elements and embodiments thereof are described in the present disclosure, the articles "a", "an", "the", and "said" are intended to mean that there are one or more elements. The terms "comprising", "including", "containing", and "having" are intended to be inclusive and mean that there may be additional elements other than the listed elements. In addition, terms such as "first" and "second" are only used to distinguish one element (or a part of an element) from another element (or another part of the element).

Unless otherwise defined, all terms (including technical and scientific terms) used herein have the same meaning as commonly understood by those skilled in the art to which the subject of the present disclosure belongs. It will be further understood that terms such as those defined in commonly used dictionaries should be interpreted as having meanings consistent with their meanings in the context of the specification and related technologies, and will not be interpreted in an idealized or overly formal form, unless otherwise clearly defined herein.

As mentioned above, a programmable logic device PLD (for example, FPGA) may be applied to a data processing device, for example, an image data processing device in the field of display technology. When an operating state of one or more logic circuits (hereinafter, also referred to as function circuits) in the programmable logic device is switched, that is, from on to off or from off to on, a required operating current of the PLD will change suddenly. Therefore, the current provided by a power supply circuit of the PLD will also have a corresponding sudden change, thereby shortening a service life of the power supply circuit.

Therefore, in view of the sudden change of the operating current of the PLD caused by the switching of the function circuit, the present disclosure provides a data processing device based on a programmable logic device. By further providing a current smoothing circuit in the device to smooth the operating current of the PLD when the function circuit is switched, the above described sudden change in the operating current of the PLD may be avoided, thereby avoiding the damage to the power supply circuit (for example, a power supply) by the sudden current change, for example, avoiding the service life from being deteriorated. Hereinafter, the device according to the embodiment of the present disclosure will be described in detail with reference to the accompanying drawings.

Figure 1:
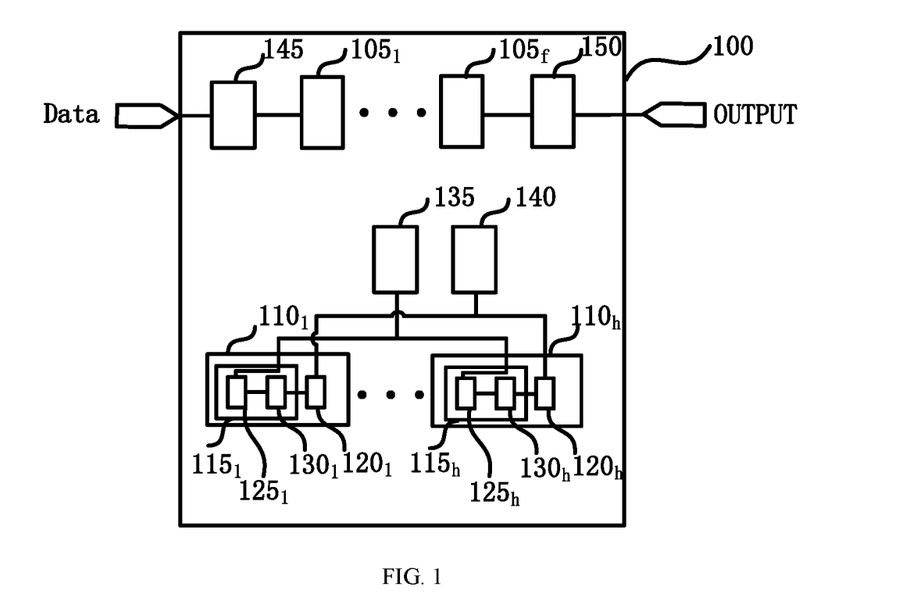
FIG. 1 shows a schematic diagram of a data processing device based on a programmable logic device according to an embodiment of the present disclosure.

FIG. 1 shows a schematic diagram of a data processing device based on a programmable logic device according to an embodiment of the present disclosure. In an embodiment of the present disclosure, a data processing device 100 based on a programmable logic device may include at least one function circuit $105_1, \ldots, 105_f$ (where f is a positive integer), and at least one current smoothing circuit $110_1, \ldots, 110_h$ (where h is a positive integer). Hereinafter, the respective circuits will be described in detail with reference to the drawings. It shall be understood that in the embodiment of the present disclosure, the circuit for realizing a specific function may be realized by configuring a flip-flop in the programmable logic device.

According to an embodiment of the present disclosure, the at least one function circuit $105_1, \ldots, 105_f$ is used to perform desired processing on input data to the data processing device. For example, in the case where the data processing device is an image data processing device, the function circuit may be an image conversion circuit, an image processing circuit, or the like. It shall be understood that according to an embodiment of the present disclosure, the function circuit may also be a sub-circuit in an image processing circuit, such as an image enhancement circuit and a dynamic processing circuit.

According to an embodiment of the present disclosure, each of the at least one current smoothing circuit $110_1, \ldots, 110_h$ corresponds to a corresponding one of the function circuits $105_1, \ldots, 105_f$, and may smooth a current change of the programmable logic device caused when the corresponding function circuit is switched between on and off. For example, the current smoothing circuit $110_1$ may correspond to the function circuit $105_1$, and the current smoothing circuit $110_1$ may smooth the current change of the programmable logic device caused when the function circuit $105_1$ is switched between on and off. In an embodiment of the present disclosure, the number of the current smoothing circuits may be less than the number of the function circuits (that is, f≤h) due to a small contribution of a certain function circuit to the sudden current change of the programmable logic device, a user setting, that a certain function circuit cannot be switched or bypassed, and the like. In an embodiment, the function circuit may be switched based on an instruction from a user of the display device. For example, if the user selects to turn on or off one or more functions through a remote control, a corresponding function circuit is switched on or off.

Further, according to an embodiment of the present disclosure, the current smoothing circuit $110_1, \ldots, 110_h$ may include control circuits $115_1, \ldots, 115_h$ and redundant circuits $120_1, \ldots, 120_h$. The control circuit may generate a driving signal for driving a corresponding redundant circuit based on a switching manner of the function circuit corresponding to the current smoothing circuit. For example, the control circuit $115_1$ may generate the driving signal based on the switching manner of the function circuit $105_1$, and thus the redundant circuit may operate according to the driving signal to smooth the current change. For example, the redundant circuit $120_1$ may smooth the current change caused when the function circuit $105_1$ is switched between on and off according to the driving signal generated by the control circuit $115_1$. In an embodiment of the present disclosure, the number of flip-flops (for example, D flip-flops) in the redundant circuit is smaller than the number of flip-flops in the corresponding function circuit. For example, the number of flip-flops in the redundant circuit $120_1$ is smaller than the number of flip-flops in the function circuit $105_1$. It may be understood that a designer may determine the number of flip-flops in the redundant circuit based on the total number of flip-flops in the programmable logic device and the number of flip-flops in the corresponding function circuit.

Further, according to an embodiment of the present disclosure, the number of flip-flops in the redundant circuit may be 1/N of the number of flip-flops in the corresponding function circuit, where N is a positive integer. N may be determined based on the number of flip-flops in the corresponding function circuit and the total number of flip-flops in the programmable logic device. For example, the number of flip-flops in the redundant circuit $120_1$ may be 1/16 of the number of flip-flops in the function circuit $105_1$. It shall be understood that the numbers of flip-flops in different redundant circuits may be different, and the ratios of the numbers of flip-flops in the different redundant circuits to the numbers of flip-flops in the corresponding function circuits may also be different.

In addition, according to an embodiment of the present disclosure, the flip-flops in the redundant circuit may be divided into M groups, where M is an integer greater than one. For example, M may be 64.

Further, according to an embodiment of the present disclosure, the control circuits $115_1, \ldots, 115_h$ include decoding control word generating circuits $125_1, \ldots, 125_h$ and decoding circuits $130_1, \ldots, 130_h$. For example, the control circuit $115_1$ may include a decoding control word generating circuit $125_1$ and a decoding circuit $130_1$. The decoding control word generating circuit may generate a control word based on the switching manner of the function circuit corresponding to the current smoothing circuit. For example, the decoding control word generating circuit $125_1$ may generate a control word based on the switching manner of the function circuit $105_1$. According to an embodiment of the present disclosure, the decoding circuit may generate a driving signal for driving the corresponding redundant circuit based on the generated control word. For example, the decoding circuit $130_1$ may generate a driving signal for the redundant circuit $120_1$ based on the control word generated by the decoding control word generating circuit $125_1$. As described above, the redundant circuit may include M groups of flip-flops. Correspondingly, the driving signal also includes M sub-driving signals. Each of the sub-driving signals is used to drive a corresponding group of the M groups of flip-flops.

In addition, as shown in FIG. 1, the data processing device 100 may further include a determining circuit 135, a storage circuit 140, an input circuit 145 and an output circuit 150.

According to an embodiment of the present disclosure, the determining circuit 135 may determine a to-be-switched function circuit and the switching manner thereof, and provide the obtained switching manner to the decoding control word generating circuit in the current smoothing circuit corresponding to the to-be-switched function circuit. For example, when the function circuit $105_1$ is to switch state, first, the determining circuit 135 may determine that the function circuit to switch state is the function circuit $105_1$, and that the function circuit $105_1$ is switched from on to off or from off to on. Then, the determining circuit 135 provides the switching manner to the decoding control word generating circuit $125_1$.

According to an embodiment of the present disclosure, the memory 40 may store corresponding operating frequencies $F_1, \ldots, F_h$ of the redundant circuits $120_1, \ldots, 120_h$. According to an embodiment of the present disclosure, a ratio of an absolute value of a difference between a maximum power of the redundant circuits $120_1, \ldots, 120_h$ at the respective operating frequencies $F_1, \ldots, F_h$ and a power of the corresponding function circuits $105_1, \ldots, 105_h$ to the power of the corresponding function circuits $105_1, \ldots, 105_h$ may be within a predetermined threshold range. It shall be understood that, in an embodiment, the maximum power of the redundant circuit at the corresponding operating frequency refers to the power consumed when all flip-flops in the redundant circuit operate at the operating frequency. For example, the ratio of the absolute value of the difference between the maximum power of the redundant circuit $120_1$ and the power of the corresponding function circuit $105_1$ to the power of the corresponding function circuit $105_1$ is within the predetermined threshold range. In an embodiment, the threshold range may be from about 0 to about 10%. It shall be understood that other ranges according to actual needs are also allowed.

According to an embodiment of the present disclosure, the input circuit 145 may receive data Data to be processed, and transmit the received data to the at least one function circuit for corresponding processing.

According to an embodiment of the present disclosure, the output circuit 150 may output the processed data from at least one function circuit to an output terminal OUTPUT.

It shall be understood that although FIG. 1 only shows a specific number of function (i.e., logic) circuits, the present disclosure is not limited thereto. The type and number of function circuits may be appropriately selected according to actual needs.

Figure 2:
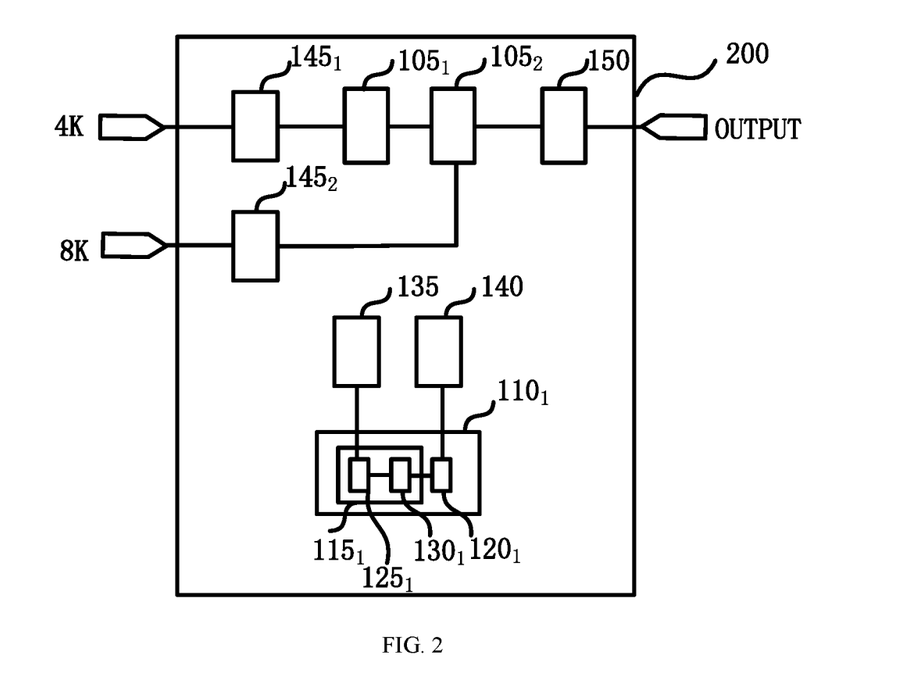
FIG. 2 shows a schematic diagram of an image data processing device based on a programmable logic device according to an embodiment of the present disclosure.

FIG. 2 shows a schematic diagram of an image data processing device 200 based on a programmable logic device according to an embodiment of the present disclosure. As shown in FIG. 2, the image data processing device 200 may include an input circuit 145, a conversion circuit $105_1$, an image processing circuit $105_2$, an output circuit 150, and a current smoothing circuit $110_1$. Hereinafter, each of the circuits will be described in detail with reference to the drawings.

According to an embodiment of the present disclosure, the input circuit 145 may include a first resolution data input circuit $145_1$ and a second resolution data input circuit $145_2$. The first resolution data input circuit $145_1$ may receive image data of a first resolution, and the second resolution data input circuit $145_2$ may receive image data of a second resolution. In an embodiment, the first resolution data input circuit $145_1$ may be a 4 k data input circuit for receiving 4 k image data. The second resolution data input circuit $145_2$ may be an 8 k data input circuit for receiving 8 k image data. According to an embodiment of the present disclosure, the 4 k image data may be provided by a system on chip SOC.

According to an embodiment of the present disclosure, the conversion circuit $105_1$ may convert 4 k image data from the 4 k data input circuit $145_1$ into 8 k image data.

According to an embodiment of the present disclosure, the image processing circuit $105_2$ may perform image processing on the 8 k image data from the conversion circuit $105_1$ or the 8 k image data from the 8 k data input circuit $145_2$. In an embodiment of the present disclosure, the image processing may include image enhancement, color space conversion, and the like. It shall be understood that in the embodiments of the present disclosure, the type of image processing is not particularly limited, and may be appropriately determined according to actual needs.

According to an embodiment of the present disclosure, the output circuit 150 may output the image data from the image processing circuit $105_2$ to the output terminal OUTPUT.

According to an embodiment of the present disclosure, the current smoothing circuit $110_1$ may smooth the current change of the programmable logic device caused when the switching circuit $105_1$ is switched between on and off.

Figure 3:
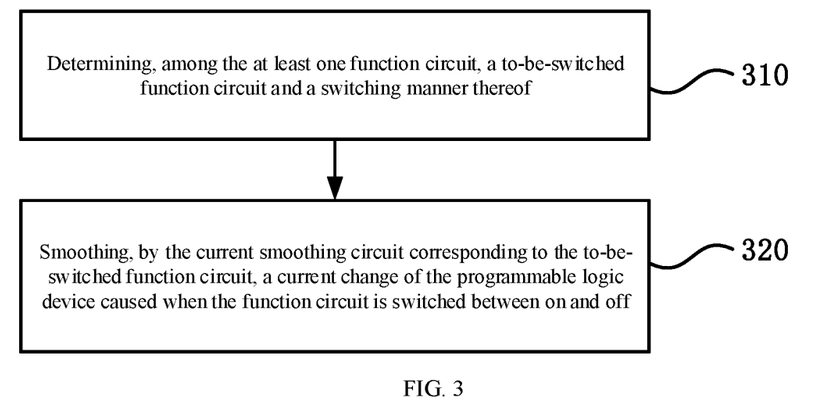
FIG. 3 shows a flowchart of a method for driving the data processing device based on the programmable logic device as shown in FIG. 1 according to an embodiment of the present disclosure.

FIG. 3 shows a flowchart of a method for driving the data processing device 100 based on the programmable logic device according to an embodiment of the present disclosure. As shown in FIG. 3, in step 310, a to-be-switched function circuit of the at least one function circuit and a switching manner thereof are determined. In an embodiment, the determining circuit 135 may determine the to-be-switched function circuit and the switching manner thereof. For example, as described above, the determining circuit 135 determines the function circuit to be switched according to a user's instruction and the switching manner thereof. In an embodiment, there may be one or more of to-be-switched function circuits. In addition, the switching manners of the to-be-switched function circuits may be the same or different. In step 320, a current change of the programmable logic device caused when the function circuit is switched between on and off is smoothed by the current smoothing circuit corresponding to the to-be-switched function circuit.

Figure 4:
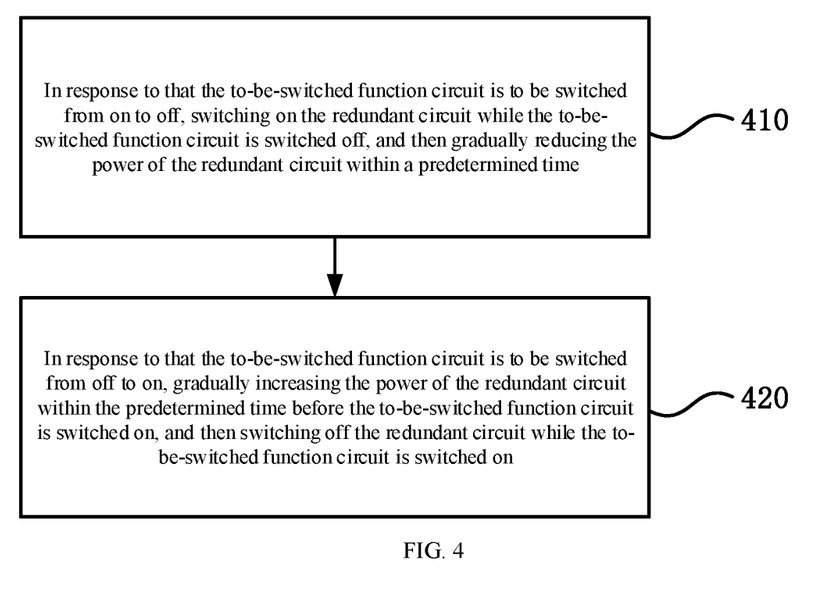
FIG. 4 shows a flowchart of a method for smoothing a current change of a programmable logic device caused when a function circuit is switched between on and off according to an embodiment of the present disclosure.

FIG. 4 further shows a method for smoothing a current change of a programmable logic device caused when the function circuit is switched between on and off according to an embodiment of the present disclosure.

As shown in FIG. 4, in step 410, in response to that the to-be-switched function circuit is to be switched from on to off, the redundant circuit is switched on while the to-be-switched function circuit is switched off, for example, to operate at a at maximum power. Then, the power of the redundant circuit is gradually reduced, for example to be zero, within a predetermined time. In an embodiment, in response to that the to-be-switched function circuit determined is to be switched from on to off, M groups of flip-flops are switched off group by group while the to-be-switched function circuit is switched off, until the M groups of flip-flops are all switched off. Specifically, a corresponding decoding control word generating circuit generates a corresponding control word (for example, binary) based on a received switching manner from on to off, and provides the control word to the corresponding decoding circuit. Then, the decoding circuit generates corresponding M groups of driving signals based on the control word, and provides the same to the corresponding redundant circuit. Based on the driving signal and the corresponding operating frequency stored in the storage circuit, the M groups of flip-flops are all switched on first to operate at the corresponding operating frequency (i.e., to make the redundant circuit to operate at the maximum power) while the switched function circuit is switched off. However, the M groups of flip-flops are switched off group by group until they are all switched. Therefore, the sudden change of the operating current of the PLD caused when the function circuit is switched from on to off can be avoided, and the service life of the power supply circuit can be prolonged.

In step 420, in response to that the to-be-switched function circuit is to be switched from off to on, the power of the redundant circuit is gradually increased for example up to be the maximum operating power of the redundant circuit within the predetermined time before the to-be-switched function circuit is switched on. Then, the redundant circuit is switched off while the to-be-switched function circuit is switched on. In an embodiment, in response to that the to-be-switched function circuit is to be switched from off to on, the power of the redundant circuit is gradually increased within the predetermined time before the to-be-switched function circuit is switched on, to make the ratio of the absolute value of the difference between the power of the redundant circuit and the power of the to-be-switched function circuit when being switched on to the power of the to-be-switched function circuit to be within the threshold range (for example, from about 0 to about 10%). Then, the redundant circuit is switched off while the to-be-switched function circuit is switched on. Specifically, in response to that the to-be-switched function circuit is to be switched from on to off, the M groups of flip-flops are switched off group by group while the to-be-switched function circuit is switched off, until the M groups of flip-flops are all switched off. Specifically, the corresponding decoding control word generating circuit generates a corresponding binary control word according to setting and based on the received switching manner from off to on, and provides the control word to the corresponding decoding circuit. Then, the decoding circuit generates corresponding M groups of driving signals based on the control word, and provides the same to the corresponding redundant circuit. The M groups of flip-flops are switched on group by group based on the driving signal and the corresponding operating frequency stored in the memory to operate at the corresponding operating frequency, for example, until the M groups of flip-flops are all switched on. Therefore, the sudden change of the operating current of the PLD caused when the function circuit is switched from off to on can be avoided, and the service life of the power supply circuit can be prolonged.

In an embodiment, the predetermined time may be 0.5 seconds, and the threshold range may be from about 0 to about 10%.

The present disclosure further provides a method for setting the data processing device as described above. In the setting method, the programmable logic device may be programmed to set the function circuit, current smoothing circuit, determining circuit, memory, input circuit, and output circuit as described above. Further, the programmable logic device may be programmed to set the control circuit in the current smoothing circuit (including the decoding control word generating circuit and the decoding circuit in the control circuit), and the redundant circuit in the current smoothing circuit.

Figure 5:
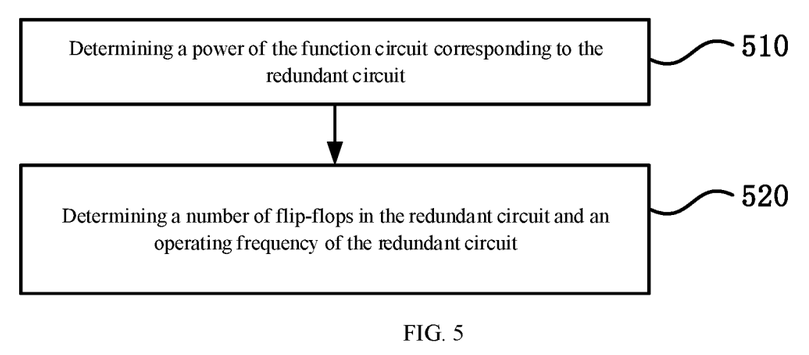
FIG. 5 shows a flow chart for setting a redundant circuit according to an embodiment of the present disclosure.

FIG. 5 shows a flow chart for setting a redundant circuit according to an embodiment of the present disclosure.

As shown in FIG. 5, in step 510, a power of the function circuit corresponding to the redundant circuit is determined.

In an embodiment, the power of the function circuit may be determined by a simulating method. For example, a normal operation power of the function circuit may be obtained by using the simulating software xillinx xpe according to the setting of parameters such as chip type, board card environment, power supply, operating frequency, and the like.

In step 520, a number of flip-flops in the redundant circuit and an operating frequency of the redundant circuit are determined. In an embodiment, the number of flip-flops in the redundant circuit and the operating frequency of the redundant circuit are determined by making a ratio of an absolute value of a difference between a power of the redundant circuit and a power of a corresponding function circuit to the power of the corresponding function circuit to be within a threshold range (for example, from about 0 to about 10%). In an embodiment, the operating frequency of the redundant circuit may also be obtained through simulating (for example, xillinx xpe).

Figure 6:
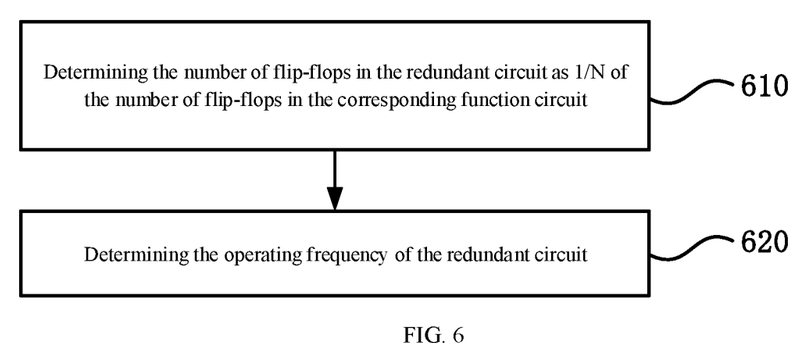
FIG. 6 shows a flowchart of a method for determining a number of flip-flops in a redundant circuit and an operating frequency of the redundant circuit according to an embodiment of the present disclosure.

FIG. 6 shows a flowchart of a method for determining the number of flip-flops in the redundant circuit and the operating frequency of the redundant circuit according to an embodiment of the present disclosure.

As shown in FIG. 6, in step 610, the number of flip-flops in the redundant circuit is determined as 1/N of the number of flip-flops in the corresponding function circuit. In an embodiment, the number of flip-flops in the function circuit may be determined when the function circuit is set by programming.

In step 620, the operating frequency of the redundant circuit is determined. In an embodiment, the operating frequency of the redundant circuit is determined by making the ratio of the absolute value of the difference between the power of the redundant circuit and the power of the corresponding function circuit to the power of the corresponding function circuit to be within the threshold range. Specifically, the operating frequency of the redundant circuit input into the simulating software by starting from the operating frequency of the corresponding function circuit and using 1/L of the operating frequency (for example, L is an integer, such as 8) as a step size, until the ratio falls within the predetermined threshold range, for example, the threshold range is from about 0 to about 10%.

In addition, in another embodiment, the operating frequency of the redundant circuit may be determined first, and then the number of flip-flops in the redundant circuit may be determined.

Figure 7:
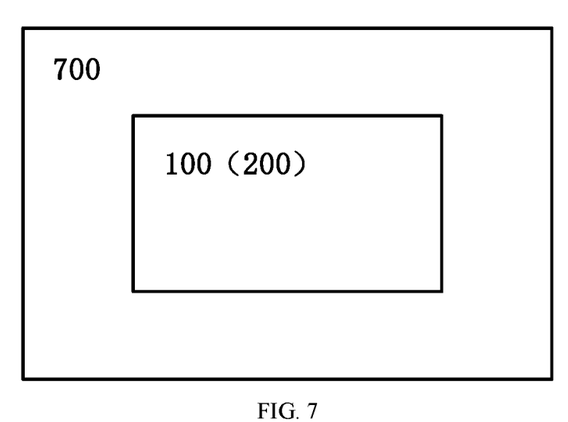
FIG. 7 shows a schematic diagram of a display device according to an embodiment of the present disclosure.

FIG. 7 shows a schematic diagram of a display device according to an embodiment of the present disclosure.

As shown in FIG. 7, the display device 700 may include the data processing circuit 100 based on the programmable logic device or the image data processing circuit 200 according to the embodiments of the present disclosure.

The display device 700 provided by the embodiment of the present disclosure may be used in any product or component with a display function. The product or component with the display function includes, but is not limited to, a display panel, a wearable device, a mobile phone, a tablet computer, a television, a notebook computer, a digital photo frame, a navigator, and the like.

Certain specific embodiments have been described herein, and these embodiments are only shown by way of example and are not intended to limit the scope of the present disclosure. In fact, the novel embodiments described herein can be implemented in various other forms. In addition, various omissions, substitutions, and changes in the form of the embodiments described herein can be made without departing from the spirit of the present disclosure. The appended claims and their equivalents are intended to cover such forms or modifications that fall within the scope and spirit of the present disclosure.

What is claimed is:

1. A data processing device based on a programmable logic device, comprising:
at least one function circuit configured to process input data; and
at least one current smoothing circuit, each of the at least one current smoothing circuit corresponding to one of the at least one function circuit, and configured to smooth a current change of the programmable logic device caused when a corresponding function circuit is switched between on and off,
wherein the at least one current smoothing circuit comprises:
a control circuit configured to generate a driving signal based on a switching manner of the function circuit corresponding to the current smoothing circuit; and
a redundant circuit configured to operate according to the driving signal to smooth the current change,
wherein the control circuit comprises:
a decoding control word generating circuit configured to generate a control word based on the switching mode of the function circuit corresponding to the current smoothing circuit; and
a decoding circuit configured to generate the driving signal based on the control word.

2. The data processing device according to claim 1, wherein a number of flip-flops in the redundant circuit is smaller than a number of flip-flops in the corresponding function circuit.

3. The data processing device according to claim 2, wherein the number of flip-flops in the redundant circuit is 1/N of the number of flip-flops in the corresponding function circuit, where N is a positive integer.

4. The data processing device according to claim 3, wherein N is 16.

5. The data processing device according to claim 1, wherein
flip-flops in the redundant circuit are divided into M groups, and
the driving signal comprises M sub-driving signals, and each of the M sub-driving signals is configured to drive a corresponding group of the M groups of flip-flops,
where M is an integer greater than 1.

6. The data processing device according to claim 5, wherein M is 64.

7. The data processing device according to claim 1, further comprising:
a determining circuit configured to determine a to-be-switched function circuit and the switching manner thereof, and to provide the switching manner obtained to the decoding control word generating circuit in the current smoothing circuit corresponding to the to-be-switched function circuit; and
a memory configured to store an operating frequency of the redundant circuit,
wherein a ratio of an absolute value of a difference between a power of the redundant circuit at the operating frequency and a power of the corresponding function circuit to the power of the corresponding function circuit is within a threshold range, and
wherein the threshold range is from 0 to 10%.

8. The data processing device according to claim 1, further comprising:
an input circuit configured to receive data to be processed and transmit the data received to the at least one function circuit; and
an output circuit configured to output the data from the at least one function circuit.

9. The data processing device according to claim 8, wherein:
the data processing device is an image data processing device;
the input circuit comprises:
a first resolution data input circuit configured to receive image data of a first resolution, and
a second resolution data input circuit, configured to receive image data of a second resolution, wherein the first resolution is smaller than the second resolution;
the at least one function circuit comprises:
a conversion circuit configured to convert the image data of the first resolution from the first resolution data input circuit into image data of the second resolution, and
an image processing circuit configured to perform image processing on the image data of the second resolution from the conversion circuit or the image data of the second resolution from the second resolution data input circuit;
the output circuit is configured to output the image data from the image processing circuit; and
the current smoothing circuit is configured to smooth the current change of the programmable logic device caused when the conversion circuit is switched between on and off.

10. The data processing device according to claim 9, wherein the image data of the first resolution is 4K image data, and the image data of the second resolution is 8K image data.

11. A method for setting the current smoothing circuit in the data processing device according to claim 1, wherein:
the method comprises setting the redundant circuit by:
determining a power of the function circuit corresponding to the redundant circuit; and
determining a number of flip-flops in the redundant circuit and an operating frequency of the redundant circuit by making a ratio of an absolute value of a difference between a maximum power of the redundant circuit and a power of a corresponding function circuit to the power of the corresponding function circuit to be within a threshold range.

12. The method according to claim 11, wherein determining the number of flip-flops in the redundant circuit and the operating frequency of the redundant circuit comprises:
determining the number of flip-flops in the redundant circuit as 1/N of the number of flip-flops in the corresponding function circuit, where N is a positive integer; and
determining the operating frequency of the redundant circuit by making the ratio of the absolute value of the difference between the maximum power of the redundant circuit and the power of the corresponding function circuit to the power of the corresponding function circuit to be within the threshold range, wherein the threshold range is from 0 to 10%.

13. A display device, comprising:
a data processing device based on a programmable logic device, wherein the data processing device comprises:
at least one function circuit configured to process input data; and at least one current smoothing circuit, each corresponding to one of the at least one function circuit, the at least one current smoothing circuit being configured to smooth a current change of the programmable logic device caused when a corresponding function circuit is switched between on and off, wherein the at least one current smoothing circuit comprises:
   a control circuit configured to generate a driving signal based on a switching manner of the function circuit corresponding to the current smoothing circuit; and
   a redundant circuit configured to operate according to the driving signal to smooth the current change,
wherein the control circuit comprises:
   a decoding control word generating circuit configured to generate a control word based on the switching mode of the function circuit corresponding to the current smoothing circuit; and
   a decoding circuit configured to generate the driving signal based on the control word.

14. A method for driving a data processing device based on a programmable logic device, comprising:
   providing the data processing device, wherein the data processing device comprises:
      at least one function circuit configured to process input data; and
      at least one current smoothing circuit, each corresponding to one of the at least one function circuit, the at least one current smoothing circuit being configured to smooth a current change of the programmable logic device caused when a corresponding function circuit is switched between on and off;
   determining, among the at least one function circuit, a to-be-switched function circuit and a switching manner thereof; and
   smoothing, by the current smoothing circuit corresponding to the to-be-switched function circuit, a current change of the programmable logic device caused when the function circuit is switched between on and off, wherein:
   the current smoothing circuit comprises a control circuit and a redundant circuit, and
   smoothing the current change of the programmable logic device caused when the function circuit is switched between on and off comprises:
      in response to that the to-be-switched function circuit is to be switched from on to off, switching on the redundant circuit while the to-be-switched function circuit is switched off, to make a ratio of an absolute value of a difference between a maximum power of the redundant circuit and a power of the to-be-switched function circuit to the power of the to-be-switched function circuit to be within a threshold range, and then gradually reducing the power of the redundant circuit within a predetermined time; and
      in response to that the to-be-switched function circuit is to be switched from off to on, gradually increasing the power of the redundant circuit within the predetermined time before the to-be-switched function circuit is switched on, to make the ratio of the absolute value of the difference between the power of the redundant circuit and the power of the to-be-switched function circuit to the power of the to-be-switched function circuit to be within the threshold range, and then switching off the redundant circuit while the to-be-switched function circuit is switched on.

15. The method according to claim 14, wherein the redundant circuit comprises M groups of flip-flops, and M is an integer greater than 1,
   wherein in response to that the to-be-switched function circuit is to be switched from on to off, the M groups of flip-flops are switched off group by group while the to-be-switched function circuit is switched off, until the M groups of flip-flops are all switched off,
   wherein in response to that the to-be-switched function circuit is to be switched from off to on, the M groups of flip-flops are switched on group by group until the M groups of flip-flops are all switched on.

* * * * *